(12) United States Patent  (10) Patent No.: US 7,869,177 B2
Lee et al.  (45) Date of Patent: Jan. 11, 2011

(54) DETECTION CIRCUITRY

(75) Inventors: Dongho Lee, Vancouver, WA (US);
David E. Smith, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 587 days.

(21) Appl. No.: 11/489,317

(22) Filed: Jul. 19, 2006

(65) Prior Publication Data

US 2008/0018310 A1  Jan. 24, 2008

(51) Int. Cl.
H02H 3/06 (2006.01)

(52) U.S. Cl. .......................... 361/93.4; 361/88

(58) Field of Classification Search ................. 361/18, 361/88, 93.1, 93.4, 93.8, 100, 118, 111, 56; 327/108, 423, 375, 463; 307/66, 90, 75, 307/108, 130; 323/265, 315, 316, 908
See application file for complete search history.

(56) References Cited

U.S. PATENT DOCUMENTS

| 4,158,866 | A | * | 6/1979 | Baker ........................... 361/86 |
| 4,363,068 | A | | 12/1982 | Burns |
| 4,375,073 | A | * | 2/1983 | Glogolja et al. ............ 361/91.4 |
| 4,835,649 | A | | 5/1989 | Salerno |
| 5,128,823 | A | | 7/1992 | Fujimoto et al. |
| 5,272,392 | A | | 12/1993 | Wong et al. |
| 5,453,899 | A | * | 9/1995 | Page ............................. 361/1 |
| 5,610,495 | A | * | 3/1997 | Yee et al. ..................... 320/116 |
| 5,828,892 | A | * | 10/1998 | Mizuta ........................ 713/300 |
| 6,118,639 | A | * | 9/2000 | Goldstein ..................... 361/55 |
| 6,285,177 | B1 | | 9/2001 | Mallikarjunaswamy |
| 6,373,671 | B1 | | 4/2002 | Watanabe et al. |
| 6,624,994 | B1 | | 9/2003 | Schmoock et al. |
| 6,781,502 | B1 | | 8/2004 | Robb |
| 7,016,171 | B2 | * | 3/2006 | Bax et al. ..................... 361/42 |

* cited by examiner

Primary Examiner—Rajnikant B Patel

(57) ABSTRACT

Embodiments of detection circuitry are disclosed.

20 Claims, 4 Drawing Sheets

DETECTION CIRCUITRY

BACKGROUND

In operation, a switch used to control the flow of electrical power to a load may be vulnerable to stresses such as current, voltage, and power loss across the switch. When stresses such as these exceed a maximum rating, as is possible when a load becomes shorted, the switch may be damaged.

DETAILED DESCRIPTION

In the following detailed description, reference is made to the accompanying drawings, which form a part hereof, and in which is shown by way of illustration specific embodiments in which the disclosed subject matter may be practiced. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

As described herein, an embodiment of protection circuitry is provided that deactivates a switch in response to a fault condition being detected across the switch. A control signal activates the switch and the protection circuitry. The protection circuitry includes detection circuitry that detects a fault condition across the switch and latching circuitry that prevents the control signal from activating the switch until the control signal is reset in response to the detection circuitry detecting a fault condition. The latching circuitry also prevents the control signal from activating the detection circuitry until the control signal is reset in response to the fault condition.

Figure 1A:
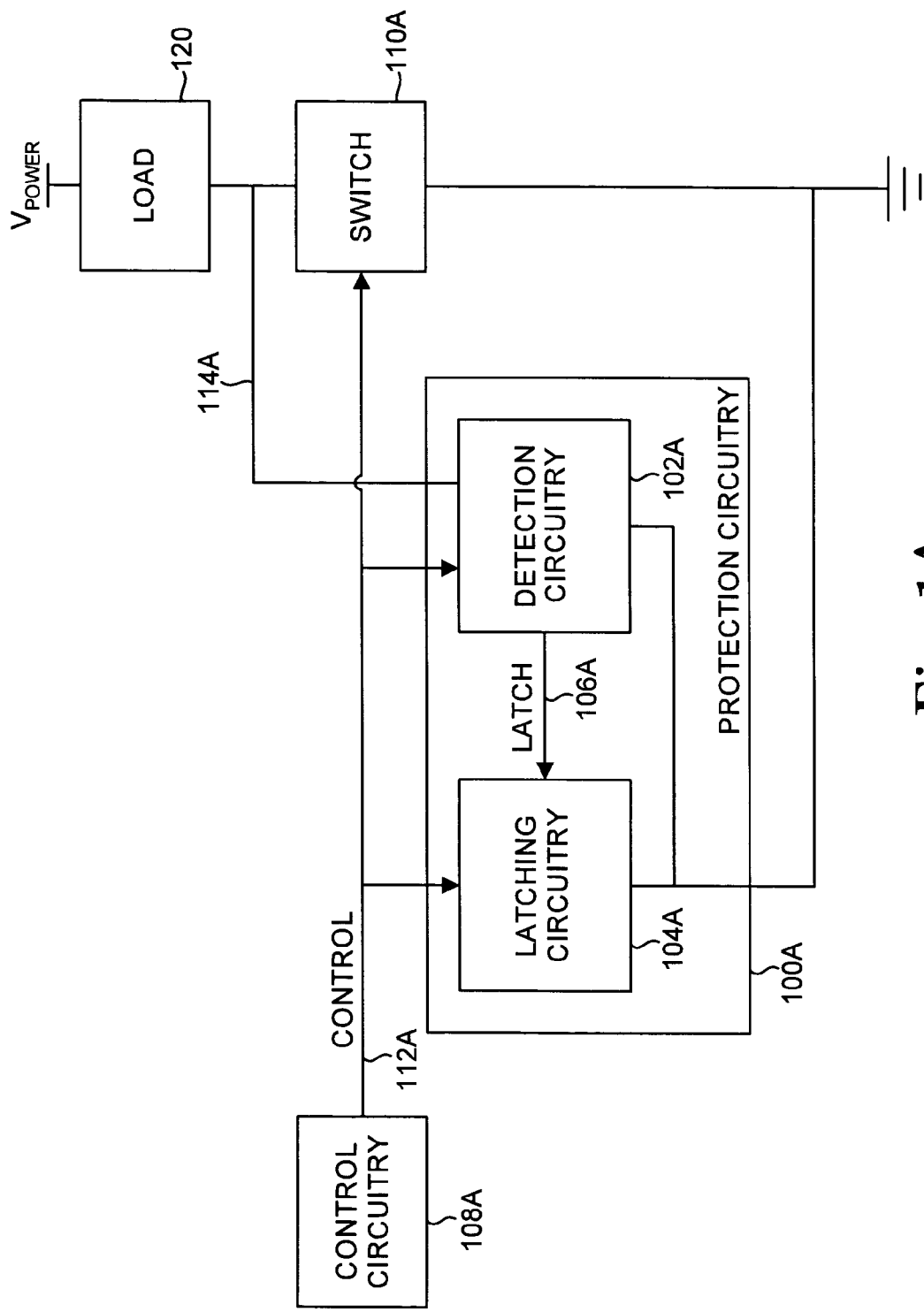
FIG. 1A is a block diagram illustrating an embodiment of protection circuitry according to one embodiment of the present disclosure.

FIG. 1A is a block diagram illustrating an embodiment of protection circuitry 100A. Protection circuitry 100A includes detection circuitry 102A and latching circuitry 104A. Control circuitry 108A provides a control signal 112A to activate and deactivate protection circuitry 100A and a switch 110A.

Switch 110A connects a load 120 to a power source, $V_{POWER}$, to provide power to load 120 in response to being activated by control signal 112A. Switch 110A disconnects load 120 from power source, $V_{POWER}$, in response to being deactivated by control signal 112A. Switch 110A includes a power switch formed using any suitable type of switching circuitry configured to operate as a switch such as a bipolar junction transistor (BJT), an insulated gate bipolar junction transistor (IGBJT), or a field effect transistor (FET).

Load 120 may be any suitable device or set of devices configured to draw electrical power from power source, $V_{POWER}$. For example, load 120 may be a DC load in a printer, a scanner, a facsimile machine, or any combination or subsystem of these devices. Load 120 may also be a solenoid, a light bulb, a heater, or a motor. In operation, load 120 is configured to draw power from the power source in response to switch 110A being activated by control signal 112A. Similarly, load 120 is configured not to draw power from the power source in response to switch 110A being deactivated by control signal 112A. In response to switch 110A being activated, current flows from the power source through load 120 and switch 110A to ground to provide power to load 120.

Along with switch 110A, protection circuitry 110A is activated by control signal 112A. If the power drawn by load 120 exceeds a threshold value, then protection circuitry 110A detects a fault condition using the voltage on a node 114A between load 120 and switch 110A. In response to detecting a fault condition, protection circuitry 100A prevents control signal 112A from activating switch 110A to disconnect load 120 from the power source until control signal 112A is reset by control circuitry 108A. Accordingly, protection circuitry 100A effectively deactivates switch 110A and prevents switch 110A from being damaged in response to detecting an excess voltage on node 114A.

In protection circuitry 100A, detection circuitry 102A is configured to be activated and deactivated by control signal 112A. In response to being activated, detection circuitry 102A detects a fault condition in response to detecting that the voltage on a node 114A between load 120 and switch 110A exceeds a threshold voltage. The fault condition indicates that excess current is drawn by load 120. In response to detecting that the voltage on node 114A exceeds the threshold voltage, detection circuitry 102A generates a latch signal 106A and provides latch signal 106A to latching circuitry 104A to indicate that a fault condition has occurred.

Latching circuitry 104A receives latch signal 106A from detection circuitry 102A and control signal 112A from control circuitry 108A. In response to latch signal 106A, latching circuitry 104A activates to prevent control signal 112A from activating switch 110A and detection circuitry 102A until control signal 112A is reset by control circuitry 108A (e.g., by removing the voltage on control signal 112A). Latching circuitry 104A prevents control signal 112A from activating switch 110A and detection circuitry 102A by reducing the voltage of control signal 112A below a level that is sufficient to activate switch 110A and detection circuitry 102A in one embodiment. When control circuitry 108A resets control signal 112A, latching circuitry 104A also resets to allow the voltage of control signal 112A to exceed the level that is sufficient to activate switch 110A and detection circuitry 102A. Accordingly, control circuitry 108A may reactivate switch 110A, along with detection circuitry 102A, by asserting control signal 112A subsequent to resetting control signal 112A.

Figure 1B:
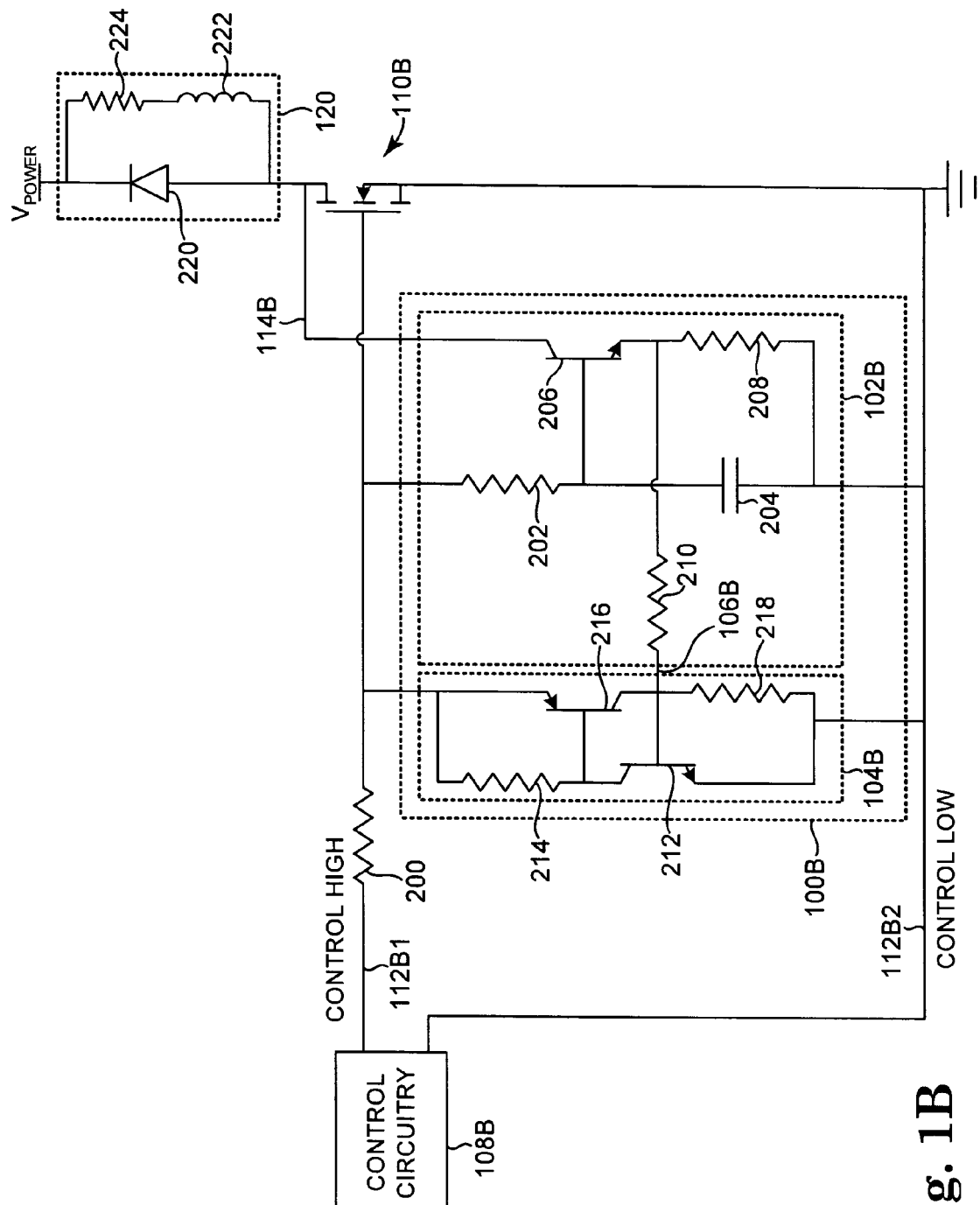
FIG. 1B is a circuit diagram illustrating another embodiment of protection circuitry according to one embodiment of the present disclosure.

FIG. 1B is a circuit diagram illustrating an embodiment of protection circuitry 100B. Protection circuitry 100B includes detection circuitry 102B and latching circuitry 104B.

Control circuitry 108B provides control high signal 112B1 and control low signal 112B2 to activate and deactivate protection circuitry 100B and a switch 110B. Control circuitry 108B provides control high signal 112B1 to detection circuitry 102B, latching circuitry 104B, and switch 110B across a resistive element 200. Control circuitry 108B provides a positive voltage potential between control high signal 112B1 and control low signal 112B2 to activate detection circuitry 102B and switch 110B, and control circuitry 108B provides a non-positive voltage potential (e.g., zero potential) between control high signal 112B1 and control low signal 112B2 to deactivate detection circuitry 102B and switch 110B. Control signals 112B1 and 112B2 will be referred to collectively as control signal 112B. Control signal 112B refers to the voltage difference between control signals 112B1 and 112B2.

Switch 110B connects a load 120 to a power source, $V_{POWER}$, to provide power to load 120 in response to being activated by control signal 112B. Switch 110B disconnects load 120 from power source, $V_{POWER}$, in response to being deactivated by control signal 112B. Switch 110B includes a power semiconductor switch formed using an n-channel MOSFET transistor with a gate connection, a source connection, and a drain connection. The gate connection connects to control high signal 112B1, the drain connection connects to load 120 at a node 114B, and the source connection connects to control low signal 112B2 and ground. In the embodiment of FIG. 1B, load 120 is represented by a diode 220 and an inductor 222 in series with a resistive element 224. In other embodiments load 120 may be represented by other circuit elements.

Along with switch 110B, protection circuitry 100B is activated by control signal 112B. If the power drawn by load 120 exceeds a threshold value, then protection circuitry 100B detects a fault condition using the voltage on node 114B between load 120 and the source connection of switch 110B. In response to detecting a fault condition, protection circuitry 100B prevents control signal 112B from activating switch 110B thereby disconnecting load 120 from the power source until control signal 112B is reset by control circuitry 108B. Accordingly, protection circuitry 100B effectively deactivates switch 110B and prevents switch 110B from being damaged in response to detecting an excess voltage on node 114B.

Detection circuitry 102B includes a resistive element 202, a capacitive element 204, an npn BJT transistor 206, and resistive elements 208 and 210. Resistive element 202 connects between resistive element 200 and a base connection of transistor 206. Capacitive element 204 connects between resistive element 202 and ground. A collector connection of transistor 206 connects to node 114B. Resistive element 208 connects between an emitter connection of transistor 206 and ground. Resistive element 210 connects between the emitter connection of transistor 206 and latch circuitry 104B.

Control signal 112B activates detection circuitry 102B by providing a voltage across resistive element 202 to turn on transistor 206. Transistor 206 turns on in response to the base current at the base of transistor 206 provided by the voltage from control signal 112B. In response to being turned on, the voltage at the emitter connection of transistor 206 approximates the voltage at the collector connection of transistor 206 which is approximately equal to the voltage across switch 110B. When the voltage across switch 110B exceeds a threshold value (i.e., detection circuitry 102B detects a fault condition), the voltage at the emitter connection of transistor 206 generates a latch signal 106B across resistive element 210 and provides the latch signal to latching circuitry 104B. The fault condition indicates that excess current is drawn by load 120.

When switch 110B is activated by control signal 112, the voltage at node 114B transitions from $V_{POWER}$ to approximately zero. During this transition period, the voltage at node 114B exceeds the threshold voltage until the voltage falls below the threshold voltage. Capacitor 204 prevents detection circuitry 102B from detecting a fault condition during this transition period by preventing sufficient base current from being applied to transistor 206 until the voltage at node 114B falls below the threshold voltage. As a result, transistor 206 does not turn on until after the voltage at node 114B falls below the threshold voltage and a fault condition is not detected solely in response to switch 110B being activated by control signal 112.

Latching circuitry 104B includes an npn BJT transistor 212, a resistive element 214, a pnp BJT transistor 216, and a resistive element 218. A base connection of transistor 212 connects to resistive element 210 to receive latch signal 106B, and an emitter connection of transistor 212 connects to ground. Resistive element 214 connects between control high signal 112B1 and a node formed by a collector connection of transistor 212 and a base connection of transistor 216. An emitter connection of transistor 216 connects to control high signal 112B1. Resistive element 218 connects between a node formed by a base connection of transistor 212 and a collector connection of transistor 216 and ground.

In response to receiving latch signal 106B, base current at the base of transistor 212 from latch signal 106B turns on transistor 212 to triggers latching circuitry 104B to latch latching circuitry 104B. In response to being latched, latching circuitry 104B prevents control signal 112B from activating switch 110B and detection circuitry 102B until control signal 112B resets control signal 112B. Latching circuitry 104B prevents control signal 112B from activating switch 110B and detection circuitry 102B by reducing the voltage of control signal 112B below a level that is sufficient to activate switch 110B and detection circuitry 102B. Control circuitry 108B resets control signal 112B by removing the voltage on control high signal 112B1. When control circuitry 108A resets control signal 112B, latching circuitry 104B also resets to allow the voltage of control high signal 112B1 to exceed the level that is sufficient to activate switch 110B and detection circuitry 102B. Accordingly, control circuitry 108B may reactivate switch 110B, along with detection circuitry 102B, by asserting control signal 112B subsequent to resetting control signal 112B.

Figure 2:
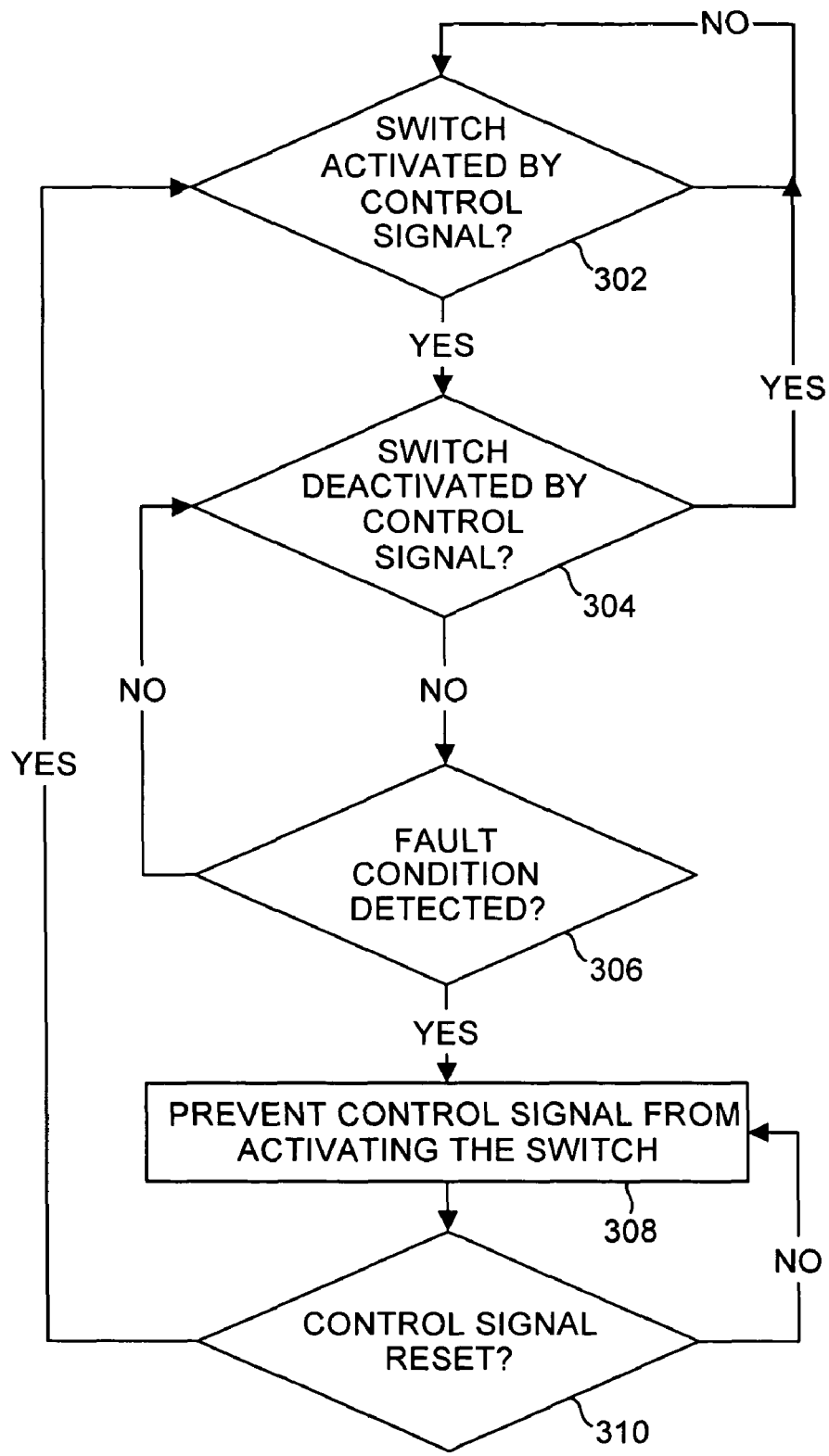
FIG. 2 is a flow chart illustrating an embodiment of a method for protecting a switch according to one embodiment of the present disclosure.

FIG. 2 is a flow chart illustrating an embodiment of a method for protecting a switch. The method shown in FIG. 2 may be implemented by protection circuitry embodiments 100A and 110B shown in FIGS. 1A and 1B, respectively.

In FIG. 2, a determination is made as to whether a switch is activated by a control signal as indicated in a block 302. If the switch is not activated by the control signal, then the function of block 302 is repeated until the switch is activated by the control signal. Once the switch is activated, a determination is made as to whether the switch is deactivated by the control signal as indicated in a block 304. If the switch is deactivated by the control signal, then the function of block 302 is repeated.

If the switch is not deactivated by the control signal, then a determination is made as to whether a fault condition is detected as indicated in a block 306. If fault condition is not detected, then the functions of blocks 304 and 306 are repeated until either the switch is deactivated by the control signal or a fault condition is detected.

If a fault condition is detected in block 306, the control signal is prevented from activating the switch as indicated in a block 308. A determination is made as to whether the control signal has been reset as indicated in a block 310. If the control signal has not been reset, then the function of block 308 is repeated until control signal has been reset. Once the control signal is reset, then the function of block 302 is repeated.

Figure 3:
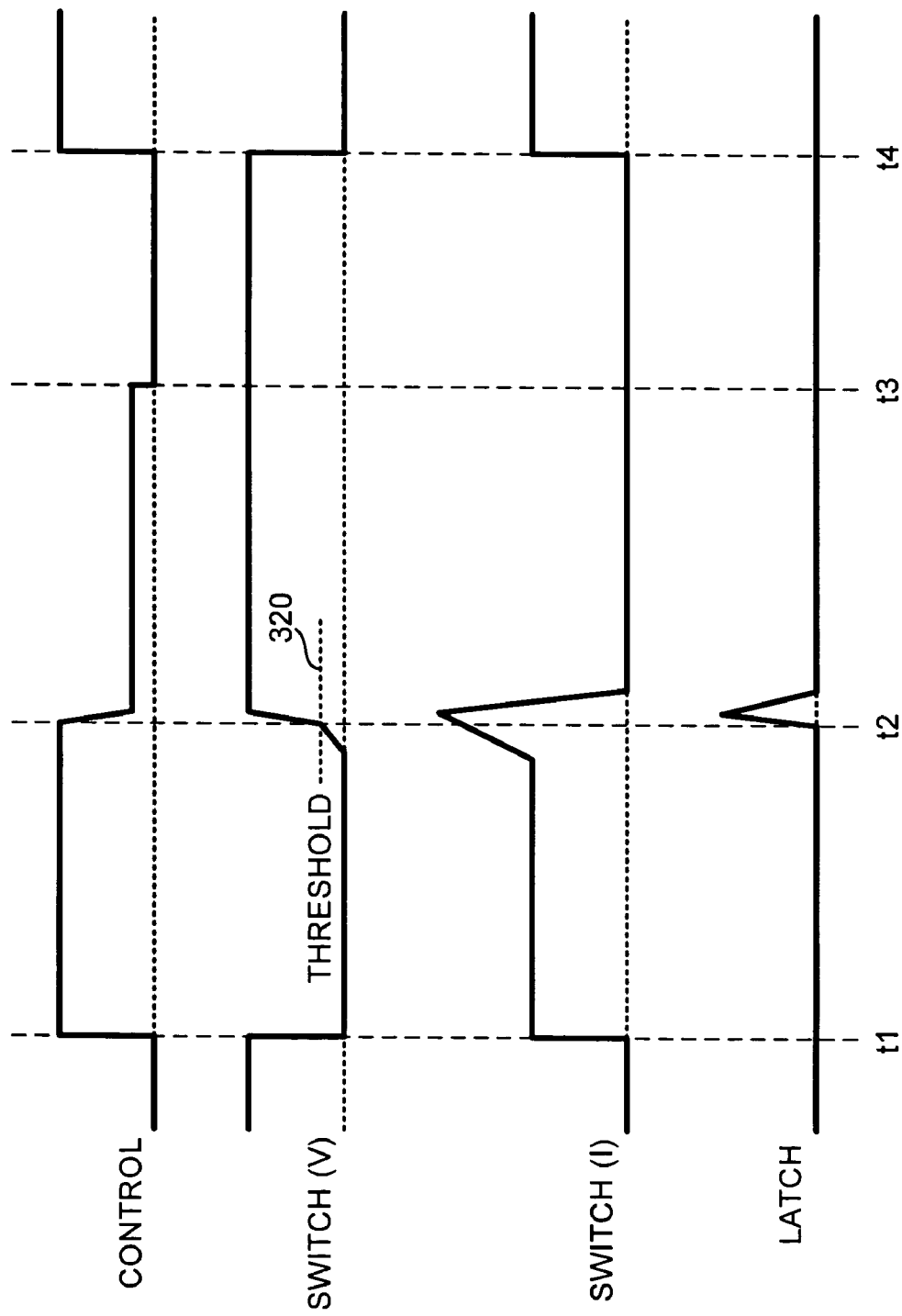
FIG. 3 is a timing diagram illustrating an embodiment of the operation of protection circuitry according to one embodiment of the present disclosure.

FIG. 3 is a timing diagram illustrating an embodiment of the operation of protection circuitry embodiments 100A and 100B shown in FIGS. 1A and 1B, respectively. FIG. 3 illustrates the timing of control signal 112A/B (CONTROL), the voltage across switch 110A/B at node 114A/B (SWITCH (V), the current through switch 110A/B (SWITCH (I), and latch signal 106A/B (LATCH). The timing diagram of FIG. 3 will be simultaneously described with reference to the embodiments of FIGS. 1A and 1B.

Control signal 112A/B is asserted to activate switch 110A/B at a time t1. When switch 110A/B is activated at time t1, the voltage across switch 110A/B transitions from approximately $V_{POWER}$ to approximately zero, and the current through switch 110A/B transitions from approximately zero to the current drawn by load 120. At a time t2, the voltage across switch 110AB exceeds a threshold voltage level 320. As a result, detection circuitry 102A/B generates latch signal 106A/B to cause control signal 112A/B to be reduced below a level that is sufficient to activate switch 110A/B. Accordingly, the voltage across switch 110A/B transitions to approximately $V_{POWER}$, and the current through switch 110A/B transitions to approximately zero.

At a time t3, control signal 112A/B is reset. Accordingly, control signal 112A/B may be reasserted, as shown at a time t4, to reactivate switch 110A/B as indicated by the voltage across switch 110A/B. When switch 110A/B is reactivated at time t4, the voltage across switch 110A/B transitions from approximately $V_{POWER}$ to approximately zero, and the current through switch 110A/B transitions from approximately zero to the current drawn by load 120.

Although specific embodiments have been illustrated and described herein for purposes of description of the embodiments, it will be appreciated by those of ordinary skill in the art that a wide variety of alternate and/or equivalent implementations may be substituted for the specific embodiments shown and described without departing from the scope of the present disclosure. Those with skill in the optical, mechanical, electromechanical, electrical, and computer arts will readily appreciate that the present disclosure may be implemented in a very wide variety of embodiments. This application is intended to cover any adaptations or variations of the disclosed embodiments discussed herein. Therefore, it is manifestly intended that the scope of the present disclosure be limited by the claims and the equivalents thereof.

What is claimed is:

1. A system comprising:
   first means for activating a switch and a second means;
   the second means for activating a third means in response to detecting a fault condition across the switch; and
   the third means for preventing the first means from activating the switch and the second means until the first means is reset in response to being activated.

2. The system of claim 1 further comprising:
   fourth means for resetting the first means subsequent to the third means being activated.

3. The system of claim 1 wherein the first means is for activating the switch and the second means by providing a voltage to the switch and the second means.

4. The system of claim 3 wherein the third means is for reducing the voltage provided to the switch and the second means in response to being activated.

5. The system of claim 1 wherein the switch includes a semiconductor switch.

6. The system of claim 1 wherein the fault condition includes a detected voltage across the switch that is above a threshold voltage.

7. The system of claim 1 wherein the fault condition indicates that excess current is drawn by a load coupled to the switch.

8. A method comprising:
   providing a control signal with a first voltage to activate a switch and detection circuitry, the switch connecting a load to a power source in response to being activated by the control signal; and
   preventing the control signal from activating the switch and the detection circuitry with the first voltage until the control signal is reset to a second voltage that differs from the first voltage in response to the detection circuitry detecting a fault condition.

9. The method of claim 8 further comprising:
   resetting the control signal subsequent to the detection circuitry detecting the fault condition; and
   providing the control signal to activate the switch and the detection circuitry subsequent to resetting the control signal.

10. The method of claim 8 further comprising:
    detecting the fault condition using the detection circuitry; and
    in response to detecting the fault condition, providing a latch signal from the detection circuitry to latch circuitry to cause the latch circuitry to prevent the control signal from activating the switch and the detection circuitry.

11. The method of claim 8 further comprising:
    providing the control signal with the first voltage to activate the switch and the detection circuitry; and
    reducing the first voltage provided to the switch and the detection circuitry in response to the detection circuitry detecting the fault condition.

12. The method of claim 8 wherein the switch includes a semiconductor switch.

13. A system comprising:
    a control signal configured to activate a switch to connect a load to a power source;
    latch circuitry; and
    detection circuitry configured to be activated by the control signal and configured to activate the latch circuitry in response to detecting a fault condition across the switch;
    wherein the latch circuitry is configured to prevent the control signal from activating the switch and the detection circuitry until the control signal is reset in response to being activated by the detection circuitry.

14. The system of claim 13 wherein the detection circuitry includes a first transistor configured to be activated by the control signal and configured to provide a latch signal to the latch circuitry in response to a voltage across the switch.

15. The system of claim 14 wherein a base connection of the first transistor is coupled to the control signal, wherein a collector connection of the first transistor is coupled to the switch, and wherein an emitter connection of the first transistor is coupled to the latch signal.

16. The system of claim 14 wherein the latch circuitry includes a second transistor that is activated by the latch signal and a third transistor, and wherein the second transistor and the third transistor prevent the control signal from activating the switch and the first transistor in response to the second transistor being activated by the latch signal.

17. The system of claim 13 wherein the control signal is coupled to a gate connection of the switch.

18. The system of claim 13 wherein the detection circuitry is configured to detect the fault condition by detecting a voltage across the switch.

19. The system of claim 13 further comprising:
    a control unit configured to generate the control signal and provide the control signal to the switch, the detection circuitry and the latch circuitry.

20. The system of claim 13 further comprising:
    the load coupled to a power source; and
    the switch coupled between the load and ground.

* * * * *